(12) United States Patent
Booth, Jr. et al.

(10) Patent No.: US 9,159,578 B2
(45) Date of Patent: *Oct. 13, 2015

(54) SELF-ALIGNED DEVICES AND METHODS OF MANUFACTURE

(71) Applicant: INTERNATIONAL BUSINESS MACHINES CORPORATION, Armonk, NY (US)

(72) Inventors: Roger A. Booth, Jr., Irvine, CA (US); Kangguo Cheng, Schenectady, NY (US); Joseph Ervin, Wappingers Falls, NY (US); Chengwen Pei, Danbury, CT (US); Ravi M. Todi, San Diego, CA (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/188,814

(22) Filed: Feb. 25, 2014

(65) Prior Publication Data

US 2014/0170854 A1   Jun. 19, 2014

Related U.S. Application Data

(63) Continuation of application No. 12/943,956, filed on Nov. 11, 2010, now Pat. No. 8,691,697.

(51) Int. Cl.
| | |
|---|---|
| *H01L 21/302* | (2006.01) |
| *B44C 1/22* | (2006.01) |
| *H01L 21/3105* | (2006.01) |
| *H01L 21/033* | (2006.01) |
| *H01L 21/3213* | (2006.01) |

(52) U.S. Cl.
CPC ...... *H01L 21/31056* (2013.01); *H01L 21/0337* (2013.01); *H01L 21/0338* (2013.01); *H01L 21/32139* (2013.01)

(58) Field of Classification Search
USPC ............................. 438/696, 947; 216/41, 58
See application file for complete search history.

(56) References Cited

U.S. PATENT DOCUMENTS

| | | |
|---|---|---|
| 4,689,869 A | 9/1987 | Jambotkar et al. |
| 4,753,899 A | 6/1988 | Colquhoun |
| 4,808,545 A | 2/1989 | Balasubramanyam et al. |
| 5,043,294 A | 8/1991 | Willer et al. |
| 6,096,659 A | 8/2000 | Gardner et al. |
| 6,159,820 A | 12/2000 | Park |
| 6,566,759 B1 | 5/2003 | Conrad et al. |

(Continued)

FOREIGN PATENT DOCUMENTS

| | | |
|---|---|---|
| JP | 2008083537 A | 4/2008 |
| JP | 200963989 | 3/2009 |
| WO | 2007103343 A1 | 9/2007 |

*Primary Examiner* — Shamim Ahmed
(74) *Attorney, Agent, or Firm* — Steven Meyers; Roberts Mlotkowski Safran & Cole, P.C.

(57) ABSTRACT

A method includes forming patterned lines on a substrate having a predetermined pitch. The method further includes forming spacer sidewalls on sidewalls of the patterned lines. The method further includes forming material in a space between the spacer sidewalls of adjacent patterned lines. The method further includes forming another patterned line from the material by protecting the material in the space between the spacer sidewalls of adjacent patterned lines while removing the spacer sidewalls. The method further includes transferring a pattern of the patterned lines and the patterned line to the substrate.

16 Claims, 7 Drawing Sheets

(56) References Cited

U.S. PATENT DOCUMENTS

| | | |
|---|---|---|
| 6,688,767 B2 | 2/2004 | Schellhase et al. |
| 6,949,458 B2 | 9/2005 | Conrad et al. |
| 6,958,275 B2 | 10/2005 | Metzler |
| 7,005,240 B2 | 2/2006 | Manger et al. |
| 7,216,331 B2 | 5/2007 | Wu et al. |
| 7,238,577 B1 | 7/2007 | Shafi |
| 7,348,108 B2 | 3/2008 | Cote et al. |
| 7,390,749 B2 | 6/2008 | Kim et al. |
| 7,585,595 B2 | 9/2009 | Pierrat |
| 7,615,496 B2 | 11/2009 | Lee et al. |
| 7,709,389 B2 | 5/2010 | Kim et al. |
| 7,718,529 B2 | 5/2010 | Deng et al. |
| 7,759,201 B2 | 7/2010 | Petti et al. |
| 2003/0108258 A1 | 6/2003 | Schellhase et al. |
| 2003/0115750 A1 | 6/2003 | Conrad et al. |
| 2004/0173844 A1 | 9/2004 | Williams et al. |
| 2005/0009272 A1 | 1/2005 | Chen et al. |
| 2007/0122977 A1 | 5/2007 | Kim et al. |
| 2008/0057445 A1 | 3/2008 | Brueck et al. |
| 2008/0115611 A1 | 5/2008 | Larson et al. |
| 2009/0170326 A1 | 7/2009 | Jung |
| 2010/0001402 A1 | 1/2010 | Meyer |
| 2010/0075476 A1 | 3/2010 | Miyashita |
| 2010/0092891 A1 | 4/2010 | Tran et al. |
| 2010/0167520 A1 | 7/2010 | Chen et al. |
| 2012/0091592 A1 | 4/2012 | Chen et al. |

SELF-ALIGNED DEVICES AND METHODS OF MANUFACTURE

FIELD OF THE INVENTION

The invention relates to semiconductor structures and methods of manufacture and, more particularly, to self-aligned devices using a pitch split mask and methods of manufacture.

BACKGROUND

New technologies, e.g., 32 nm and beyond, require features on a wafer with tighter pitch than can be directly patterned with state of the art and next generation lithography tools. The current solution to pattern such features involves printing half of the features on one mask, and half on another mask. This enables the pitch to be doubled. This doubling of pitch is designed to move the structure to within the operating range of current and next generation lithography tools.

More specifically, known pitch doubling techniques fall into two categories:
 direct printing with two masks; and
 self-aligned using sidewall image transfer.
However, each of these fabrication methodologies have their own shortcomings.

In the case of direct printing with two masks, non self-aligned pitch split techniques allow the patterning of arbitrary features, however, they suffer from overlay error between the two masks which is a persistent problem. The overlay error costs rework and drives significant variation in electrical properties. Currently, there is no solution that exists to prevent the overlay error.

Sidewall image transfer schemes, on the other hand, remove overlay sensitivity, but are extraordinarily restrictive in the features which can be patterned. The restriction in design space means that design scaling is jeopardized by the new restrictions from the self-aligned schemes.

Accordingly, there exists a need in the art to overcome the deficiencies and limitations described hereinabove.

SUMMARY

In a first aspect of the invention, a method comprises forming patterned lines on a substrate having a predetermined pitch. The method further comprises forming spacer sidewalls on sidewalls of the patterned lines. The method further comprises forming material in a space between the spacer sidewalls of adjacent patterned lines. The method further comprises forming another patterned line from the material by protecting the material in the space between the spacer sidewalls of adjacent patterned lines while removing the spacer sidewalls. The method further comprises transferring a pattern of the patterned lines and the another patterned line to the substrate.

In another aspect of the invention, a method comprises forming patterned lines on a substrate by direct lithographic patterning. The method further comprises forming spacer sidewalls on sidewalls of the patterned lines which have a thickness of about one half a pitch of the patterned lines. The spacer sidewalls are of a material that can be selectively etched with respect to the patterned lines and the substrate. The method further comprises forming a material between the spacer sidewalls of the patterned lines. The method further comprises forming a resist pattern on the material which has ends landing on the spacer sidewalls of adjacent patterned lines and remote from the patterned lines. The method further comprises removing the spacer sidewalls and the resist pattern to form a patterned material between the patterned lines, which splits a pitch of the patterned lines. The method further comprises transferring a pattern of the patterned lines and the patterned material to the substrate to form patterned features having a pitch of about one half of a pitch of the patterned lines.

In yet another aspect of the invention, a method in a computer-aided design system for generating a functional design model of a semiconductor structure, the method comprises generating a functional representation of patterned lines on a substrate having a predetermined pitch. The method further comprises generating a functional representation of spacer sidewalls on sidewalls of the patterned lines. The method further comprises generating a functional representation of material in a space between the spacer sidewalls of adjacent patterned lines. The method further comprises generating a functional representation of another patterned line formed from the material by protecting the material in the space between the spacer sidewalls of adjacent patterned lines while removing the spacer sidewalls. The method further comprises generating a functional representation of a pattern in the substrate transferred from the patterned lines and the another patterned line.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the self-aligned device, which comprises the structures of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to self-aligned devices using a pitch split mask and methods of manufacture. More specifically, the present invention provides a pitch doubling process, which allows patterning of nearly arbitrary shapes and/or features, while reducing and/or eliminating sensitivity to overlay error between masks. Advantageously, the methods of the present invention also provide a process to pattern arbitrary shapes while maintaining minimum pitch features that are self-aligned to one another. The present invention also provides methods and resulting devices with minimal spacing between patterned features, e.g., tighter pitch than can be directly patterned using existing lithography tools.

Figure 1:
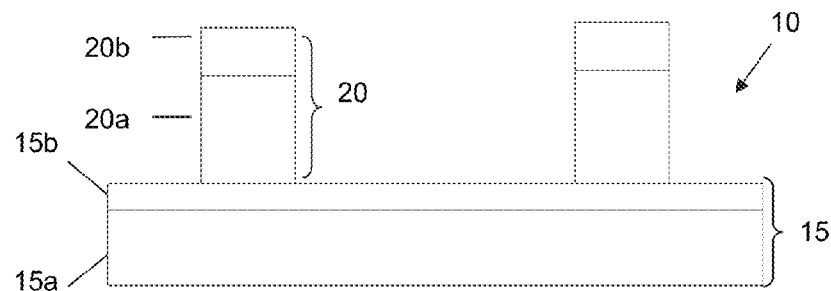
FIGS. 1-9 show structures and respective processing steps in accordance with aspects of the invention.

FIG. 1 shows a beginning structure and respective processing steps in accordance with aspects of the invention. More specifically, the beginning structure 10 includes a substrate 15. The substrate (or hardmask) 15 includes, for example, a metal layer 15a and an insulator layer 15b. In embodiments, the metal layer 15a can be, for example, TiN, and the insulator layer 15b can be, for example, oxide or Dielectric Anti-Reflective Coating (DARC). Other materials are also contemplated by the invention that are selective to etching processes with respect to other layers.

In embodiments, patterned lines 20 are formed on the insulator layer 15b. The patterned lines 20 can be a stack of, for example, poly material 20a with a nitride cap 20 or, alternatively, poly material 20a with an advanced patterning film 20b. In embodiments, the advanced patterning film 20b is matched with the Dielectric Anti-Reflective Coating (DARC) 15b.

The patterned lines 20 are formed using conventional processes such as, for example, deposition, direct patterning lithography and etching processes. The use of conventional lithographic tools and processes is possible because the patterned lines 20 are at a minimal pitch capable of being achieved with current lithographic tools. In embodiments, the materials 20a, 20b are deposited on the insulator layer 15b using conventional deposition processes such as, for example, chemical vapor deposition (CVD) processes. A resist is formed over the material 20b and patterned using a lithographic tool. The materials 20a, 20b then undergo an etching process, e.g., reactive ion etching (RIE), to form the patterned lines 20. In embodiments, the patterned lines 20 have a pitch of about 80 nm and could even achieve a pitch of about 40 nm, capable of being achieved with direct patterning lithographic processes. In embodiments, the processes of the present invention can extended to the useful range of other tools, e.g., older generation tools, such as, for example, 248 nm lithography tools could employ the methods of the present invention to pattern pitches which currently can only be achieved with significantly more expensive 193 nm immersion tools.

Figure 2:
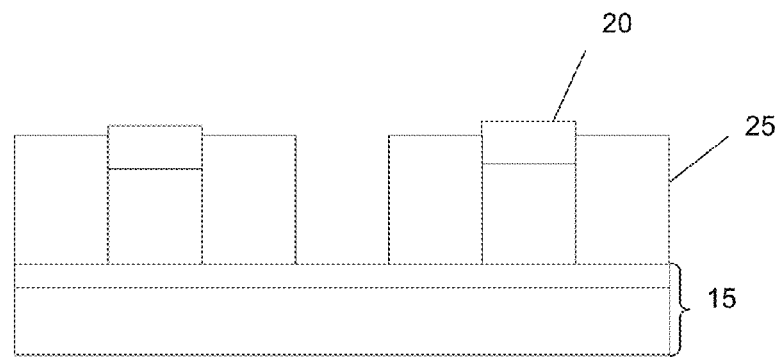

In FIG. 2, sacrificial spacers 25 are formed on sidewalls of the patterned lines 20. The sacrificial spacers 25 should allow for selective etching with the materials 20a, 20b. For example, the sacrificial spacers 25 can be, for example, nitride material deposited using conventional CVD processes. In embodiments, the sacrificial spacers 25 have a thickness of about one half of the pitch between the patterned lines 20.

Figure 3:
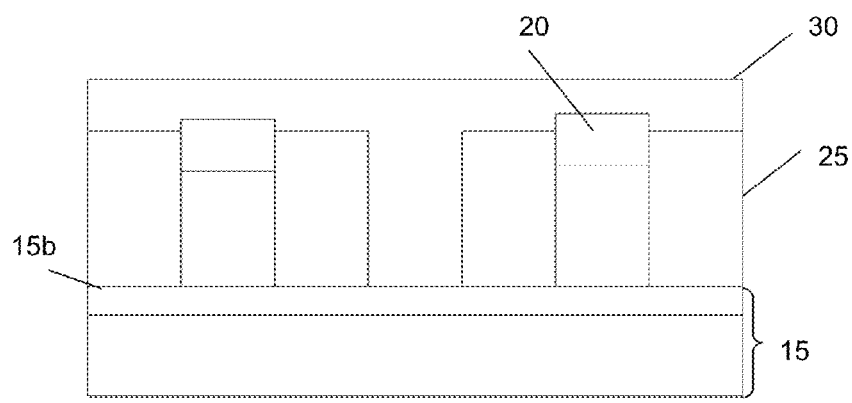

In FIG. 3, a material 30 is deposited on the sacrificial spacers 25, as well as the patterned lines 20 and exposed portions of the material 15b. In embodiments, the material 30 can be, for example, poly with an optical planarization layer. In embodiments, the material 30 can undergo a planarization process such as, for example, chemical mechanical polishing (CMP).

Figure 4:
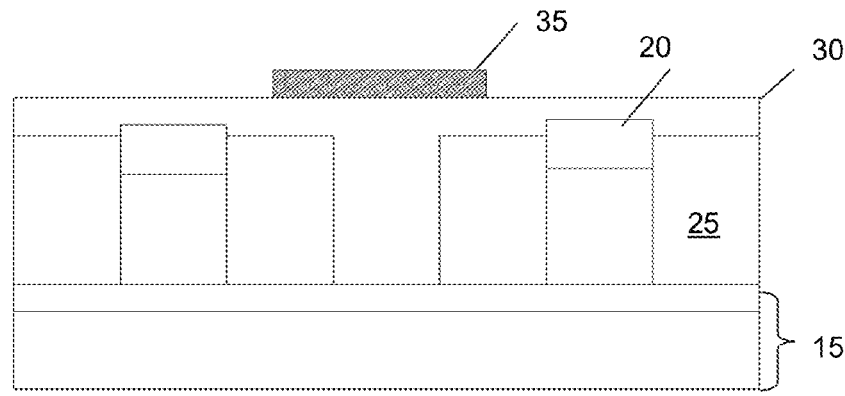

In FIG. 4, a resist 35 is formed on the material 30. In embodiments, the resist 35 is patterned to overlap with the sacrificial spacers 25, e.g., land of the sacrificial spacers 25. The resist 35 can undergo further compensation in order to control the spacing between the adjacent patterned lines 20, e.g., control a space between the patterned lines 20 and a soon to be formed patterned feature (or said otherwise, control a width of the soon to be formed patterned feature). In embodiments, the resist 35 does not overlap with the adjacent patterned lines 20. The resist 35 can be referred to as a split pitch mask, as the patterned line formed from the resist 35 will split the pitch between the patterned lines 20.

Figure 5:
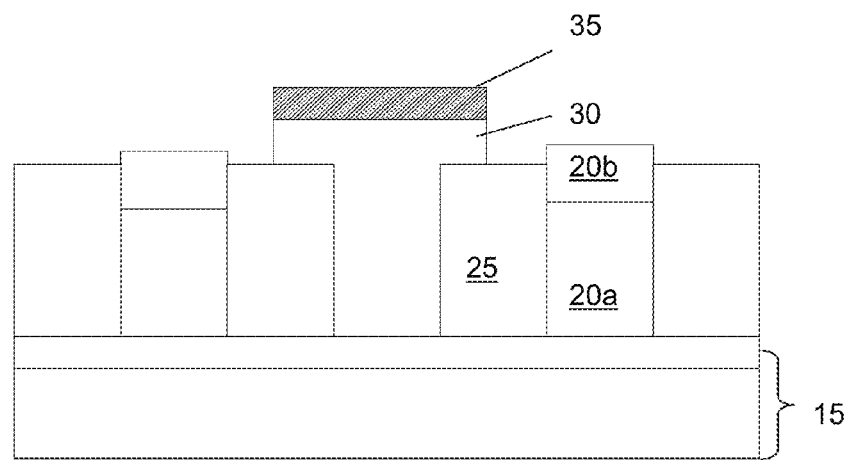

As shown in FIG. 5, the material 30 undergoes an etching process, with the patterned resist 35 protecting portions of the material 30 between the adjacent patterned lines 20. In this way, only the unprotected material 30 will be stripped or removed during the etching process. In embodiments, the material 20b, e.g., nitride, will protect the patterned lines 20 during the etching process.

Figure 6:
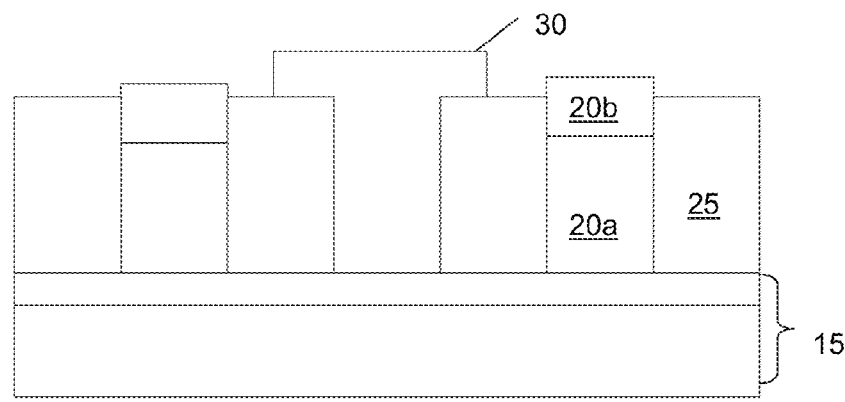
Figure 7:
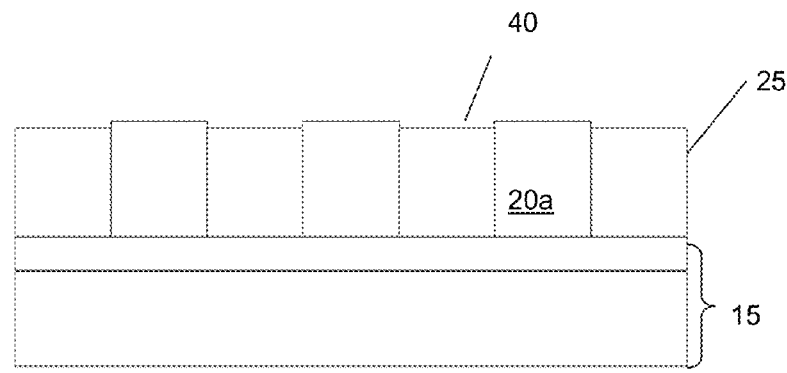

In FIG. 6, the resist is removed using conventional stripping processes. In FIG. 7, the material 30 undergoes a polishing process to remove excessive material 30. In this process, the material 20b, e.g., nitride, can also be removed from the patterned lines 20, and the entire structure polished to provide a planar or near (substantial) planar surface 40. In alternate embodiments, the polishing can occur prior to the formation of the resist.

Figure 8:
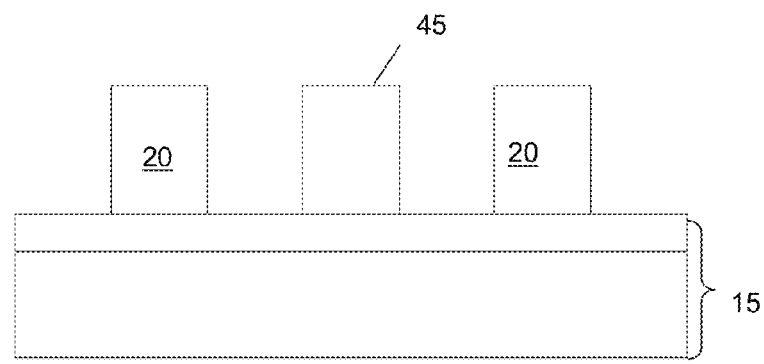

As shown in FIG. 8, the sacrificial spacers 25 are removed by a selective etching process, e.g., selective to the spacer material. This process leaves an additional patterned line (feature) 45 between the adjacent patterned lines 20, which splits the pitch between the patterned lines 20. More specifically, the patterned line 45 formed between the patterned lines 20 results in a split pitch that is about half of the pitch between the original patterned lines 20. In embodiments, the processes of the present invention can extended to the useful range of other tools, e.g., older generation tools, such as, for example, 248 nm lithography tools could employ the methods of the present invention to pattern pitches which currently can only be achieved with significantly more expensive 193 nm immersion tools.

Figure 9:
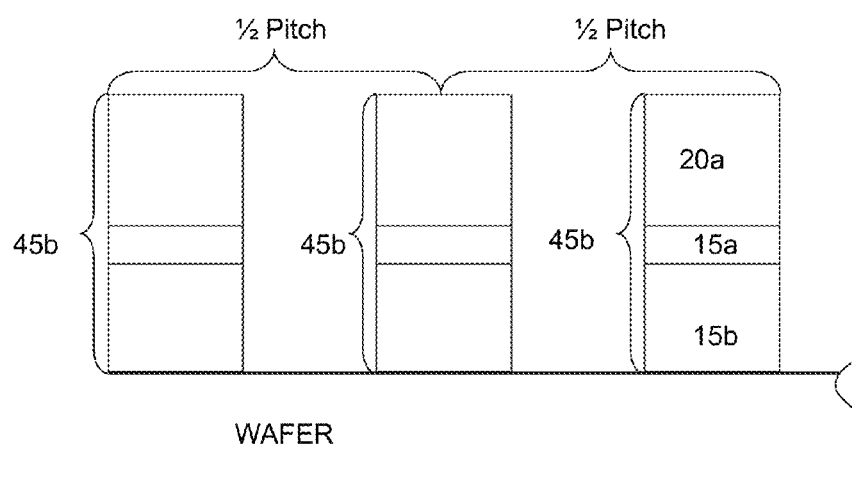

In FIG. 9, the pattern of the patterned lines 20 and the patterned line 45 are transferred to the underlying substrate 15 to form minimum pitch patterns (or features) 45a, 45b and 45c. That is, the resultant pitch between the patterns 45a, 45b and 45c is about half the pitch that can be formed by direct patterning of the original patterned lines 20. The resultant pitch is preferably 40 nm, as one illustrative example; although other pitches are also contemplated by the present invention as disclosed above. In embodiments, the pattern can be transferred using an etch that is selective to the substrate 15.

The split pitch pattern of the present invention cannot be achieved using direct patterning techniques. This is because current lithographic tools are not capable of such tight pitches. Also, compared to other conventional lithographic processes, the formation of the patterned features 45a, 45b and 45c do not require two masks and hence, the processes of the present invention eliminate sensitivity to overlay error between masks. Moreover, the processes of the present invention provide the flexibility to pattern arbitrary shapes while maintaining minimum pitch features that are self-aligned to one another. This latter advantage cannot be achieved using sidewall imaging transfer techniques.

Figure 10:
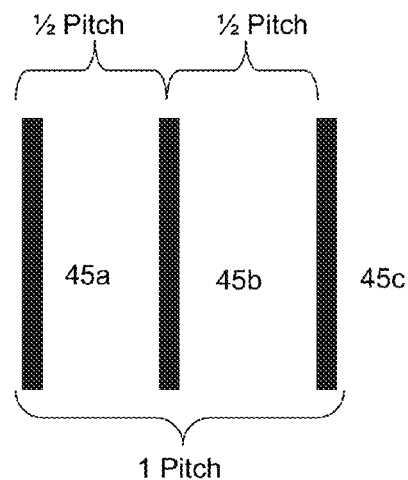
FIGS. 10 and 11 show top views of structures in accordance with aspects of the invention.

FIG. 10 shows a top view of structures in accordance with aspects of the invention. More specifically, FIG. 10 shows a top view of the structure of FIG. 9, for example. As shown in FIG. 10, the patterned features 45a, 45b and 45c are at about one half pitch which is achievable by using direct lithography techniques with patterned lines 20. More specifically, the pitch between the patterned features 45a and 45b and the pitch between the patterned features 45b and 45c are one half the pitch of the patterned features 45a and 45c, which can be formed by conventional direct patterning lithographic processes using the patterned lines 20.

Figure 11:
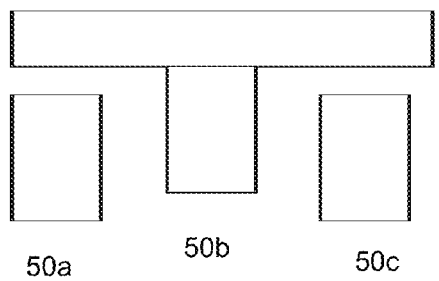

FIG. 11 shows an arbitrary shaped patterned feature 50b at one half pitch between patterned features 50a and 50c. In embodiments, the arbitrary shaped patterned feature 50b is a "T" shaped pattern; although other patterned features are also contemplated by the present invention. This arbitrary shape at one half pitch cannot be formed using conventional lithographic processes.

Figure 12:
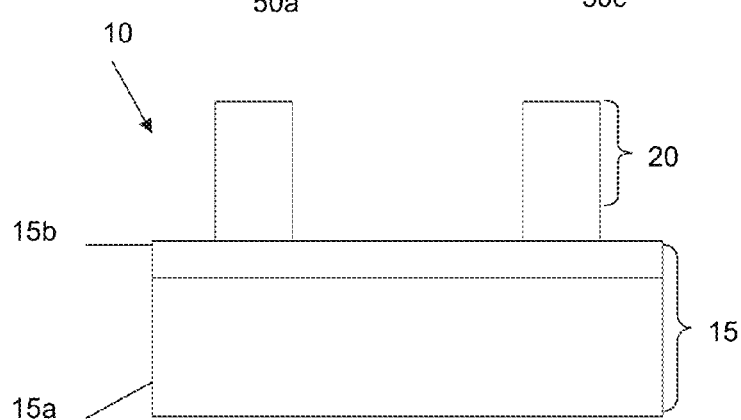
FIGS. 12-18 show structures and respective processing steps in accordance with additional aspects of the invention.

FIG. 12 shows a beginning structure and respective processing steps in accordance with additional aspects of the invention. More specifically, the beginning structure 10 includes a substrate 15. The substrate (or hardmask) 15 includes, for example, a metal layer 15a and an insulator layer 15b. In embodiments, the metal layer 15a can be, for example, TiN, and the insulator layer 15b can be, for example, oxide or Dielectric Anti-Reflective Coating (DARC). Other materials are also contemplated by the invention that are selective to etching processes with respect to other layers.

In embodiments, patterned lines 20 are formed on the insulator layer 15b. The patterned lines 20 can be any mask material such as, for example, poly or other material that allows for selective etching of the substrate 15. The patterned lines 20 are formed using conventional deposition, lithographic and etching processes as discussed with reference to FIG. 1.

Figure 13:
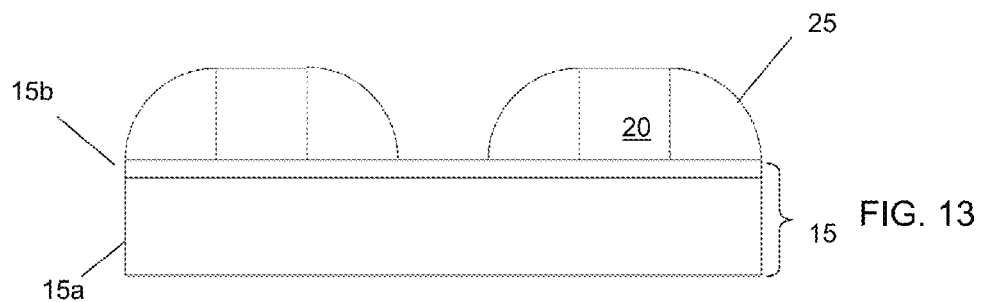

In FIG. 13, sacrificial spacers 25 are formed on sidewalls of the patterned lines 20. The sacrificial spacers 25 can be, for example, nitride deposited using conventional CVD processes. In embodiments, the sacrificial spacers 25 have a thickness of about one half of the pitch between the patterned lines 20

Figure 14:
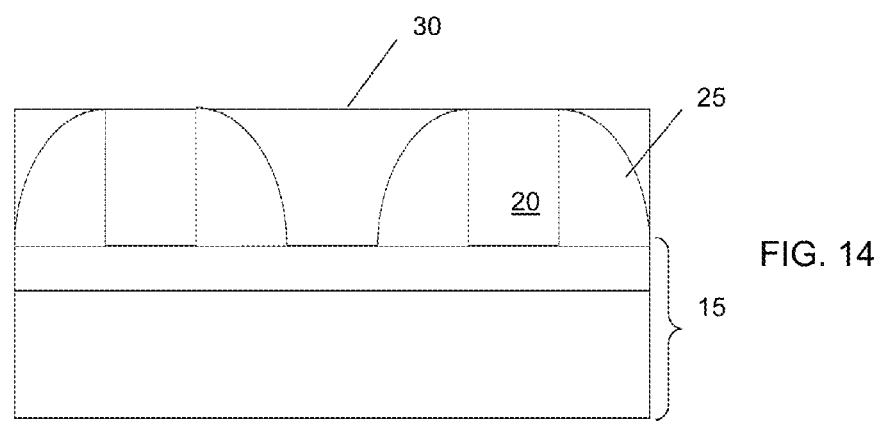

In FIG. 14, a material 30 is deposited on the sacrificial spacers 25, as well as the patterned lines 20 and exposed portions of the material 15b. In embodiments, the material 30 can be, for example, poly with an optical planarization layer. In embodiments, the material 30 undergoes a planarization process such as, for example, chemical mechanical polishing (CMP), to be substantially planar with top surfaces of the patterned lines 20.

Figure 15:
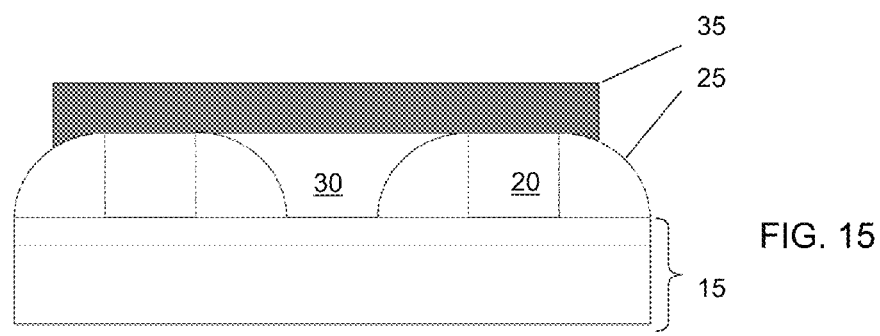
Figure 16:
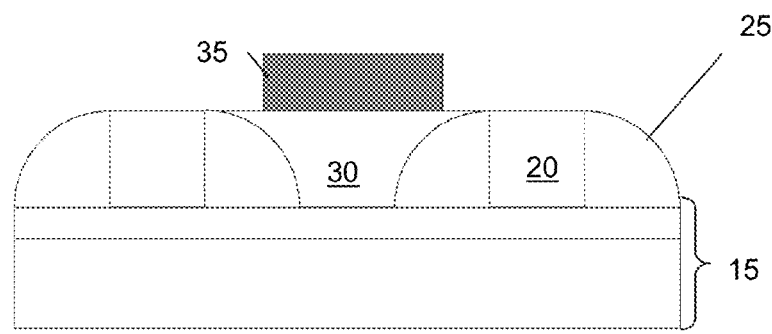

In FIG. 15, a resist 35 is formed on the material 30. In FIG. 16, the resist 35 is patterned to overlap with the sacrificial spacers 25, e.g., land of the sacrificial spacers 25. The resist 35 can undergo further compensation in order to control the spacing between the adjacent patterned lines 20, e.g., control a space between the patterned lines 20 and a soon to be formed patterned feature (or said otherwise, control a width of the soon to be formed patterned feature). In embodiments, the resist 35 does not overlap with the adjacent patterned lines 20. The resist 35 can be referred to as a split pitch mask, as the patterned line formed from the resist 35 will split the pitch between the patterned lines 20.

Figure 17:
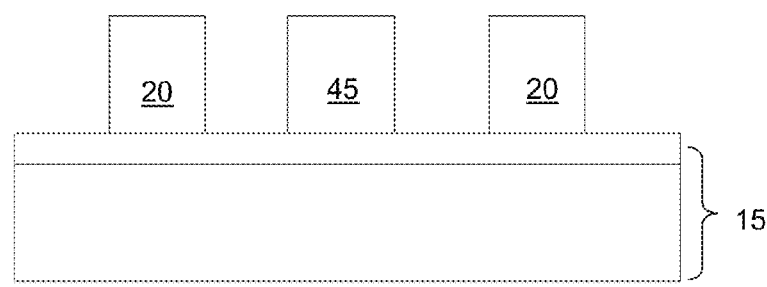

As shown in FIG. 17, the spacers are removed using an etching process, with the patterned resist 25 protecting portions of the material 30 between the adjacent patterned lines 20. In this way, only the unprotected spacers will undergo an etching process, e.g., removal process. As in the structure of FIG. 8, this process leaves an additional patterned line 45 between the adjacent patterned lines 20, which splits the pitch between the patterned lines 20. More specifically, the patterned line 45 formed between the patterned lines 20 results in a split pitch that is about half of the pitch between the original patterned lines 20. This split pitch cannot by obtained by conventional lithographic tools, i.e., in the same manner which formed patterned lines 20. The resultant pitch is about 40 nm, in one illustrative example; although other pitches are also contemplated by the present invention as disclosed above.

Figure 18:
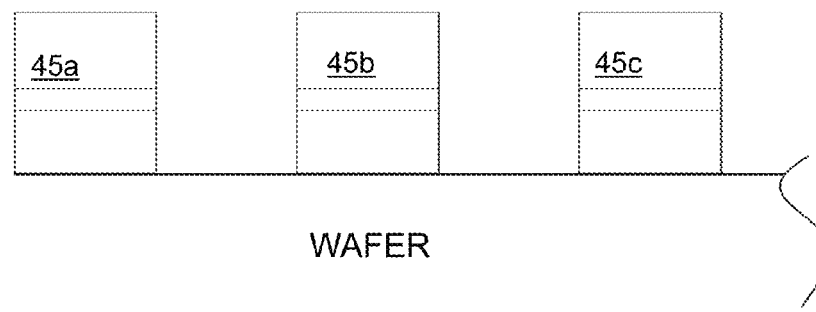

In FIG. 18, the pattern of the patterned lines 20 and 45 is transferred to the underlying substrate 15 to form minimum pitch patterned features 45a, 45b and 45c. In embodiments, the patterned features 45a, 45b and 45c can be transferred using an etch chemistry that is selective to the substrate 15.

Similar to above, in this aspect of the present invention, the split pitch pattern of cannot be achieved using direct patterning techniques. Also, compared to other conventional lithographic processes, the formation of the patterned lines do not require two masks and hence, the processes of the present invention eliminate sensitivity to overlay error between masks. Moreover, the processes of the present invention provide the flexibility to pattern arbitrary shapes while maintaining minimum pitch features that are self-aligned to one another.

Figure 19:
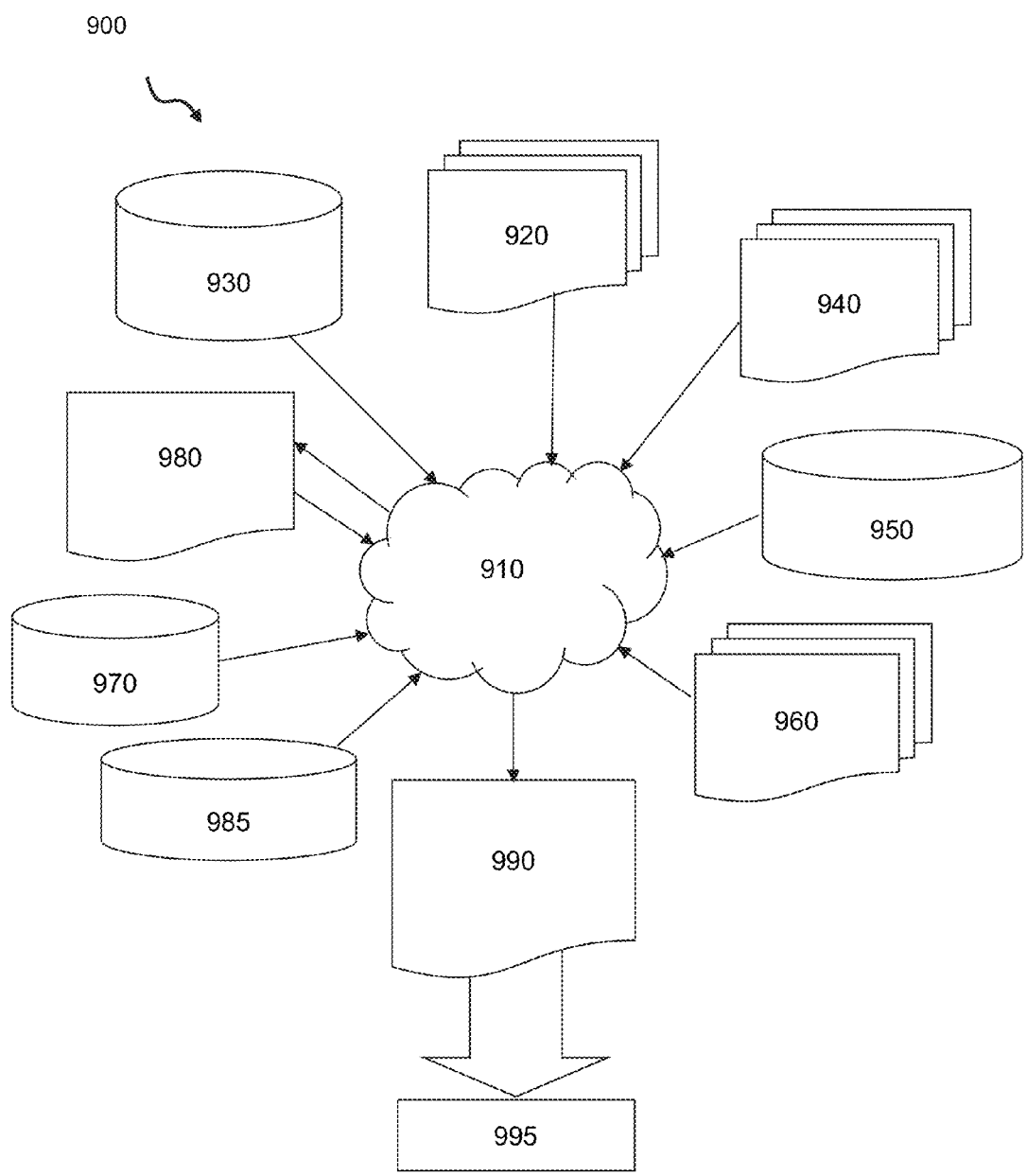
FIG. 19 is a flow diagram of a design process used in semiconductor design, manufacture, and/or test.

FIG. 19 is a flow diagram of a design process used in semiconductor design, manufacture, and/or test. FIG. 19 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-18. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 19 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-18. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-18 to generate a netlist 980, which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985, which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-18. In one embodiment, design structure 990 may comprise a compiled, executable HDL simulation model that functionally simulates the devices shown in FIGS. 1-18.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-18. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method, comprising:
   forming patterned lines at a predetermined pitch on a substrate;
   forming spacers on sidewalls of the patterned lines;
   forming a material in a space between the spacers;
   forming a mask on the material that splits the pitch between the patterned lines; and
   forming another patterned line from the material by selectively removing the spacers and the mask.

2. The method of claim 1, wherein the forming the spacers comprises forming the spacers at a thickness that is about one half the predetermined pitch.

3. The method of claim 1, wherein the removing comprises selectively etching the spacers and the mask.

4. The method of claim 1, wherein the forming the patterned lines comprises performing a direct patterning lithographic processes to form the patterned lines.

5. The method of claim 1, further comprising transferring a pattern of the patterned lines and the another patterned line to the substrate.

6. The method of claim 5, wherein the pattern transferred to the substrate has a pitch that is about one half the predetermined pitch.

7. The method of claim 1, wherein the material is a material that resists an etchant used for the selective removal of the mask and the spacers.

8. The method of claim 1, wherein a pitch of the another patterned is about one half the pitch of the predetermined pitch.

9. The method of claim 1, wherein the forming the mask comprises:
   forming a resist on the material and
   patterning the resist to have ends that are over the spacers of adjacent ones of the patterned lines and are remote from the adjacent ones of the patterned lines patterned lines.

10. The method of claim 9, wherein the resist is compensated to adjust a width of the another patterned line.

11. The method of claim 1, wherein the forming patterned lines comprises forming a respective a capping layer on respective top surfaces of the patterned lines that protects the top surfaces of the patterned lines during the forming of the another patterned line.

12. The method of claim 11, wherein the forming of the another patterned line further comprises:
   removing the capping layer; and
   planarizing the material to form a top surface of the another patterned line that is a substantially planar with the top surfaces of the patterned lines.

13. The method of claim 1, wherein the forming the spacers comprises forming the spacers using a nitride material.

14. The method of claim 1, wherein prior to the removing the spacers sidewalls and after the removing the mask, the method further comprises planarizing the material to be substantially planar with top surfaces of the patterned lines.

15. The method of claim 1, wherein the method further comprises planarizing the material to be substantially planar with top surfaces of the patterned lines prior to the forming the mask.

16. The method of claim 15, wherein the mask is patterned on the planarized material.

* * * * *